United States Patent [19]

Angeleri et al.

[11] Patent Number: 4,786,256

[45] Date of Patent: Nov. 22, 1988

[54] BURN IN SOCKET FOR FLAT PACK SEMICONDUCTOR PACKAGE

[75] Inventors: Angelo V. Angeleri, Mesa; David A. Babow, Scottsdale, both of Ariz.

[73] Assignee: AMP Incorporated, Harrisburg, Pa.

[21] Appl. No.: 34,303

[22] Filed: Apr. 3, 1987

[51] Int. Cl.⁴ .................... H01R 13/627; H01R 23/72
[52] U.S. Cl. ........................................ 439/72; 439/330
[58] Field of Search ..................... 439/59, 60, 62, 64, 439/68–78, 330, 331, 353, 372, 525, 526

[56] References Cited

U.S. PATENT DOCUMENTS

| | | | |
|---|---|---|---|
| 3,393,396 | 5/1966 | Majewski | 439/525 |
| 3,409,861 | 11/1968 | Barnes et al. | 439/331 |
| 3,510,828 | 5/1970 | Schwab et al. | 339/174 |
| 3,892,312 | 7/1975 | Tems | 439/70 |
| 3,951,495 | 4/1976 | Donaher et al. | 439/71 |
| 3,960,423 | 6/1976 | Weisenburger | 439/71 |
| 4,176,895 | 12/1979 | Aldridge | 439/71 |
| 4,236,777 | 12/1980 | Merlina et al. | 439/71 |
| 4,268,102 | 5/1981 | Grabbe | 439/70 |
| 4,354,729 | 10/1982 | Grabbe et al. | 439/733 |
| 4,359,252 | 11/1982 | Olsson et al. | 439/331 |
| 4,427,249 | 12/1984 | Bright et al. | 439/68 |
| 4,511,197 | 4/1985 | Grabbe et al. | 439/69 |
| 4,513,353 | 4/1985 | Bakermans et al. | 361/399 |
| 4,542,949 | 9/1985 | Tewes et al. | 439/70 |
| 4,553,805 | 11/1985 | Aikens . | |
| 4,583,806 | 4/1986 | Tainter, Jr. et al. . | |
| 4,684,184 | 8/1987 | Grabbe et al. | 439/64 |
| 4,717,347 | 1/1988 | Babow et al. | 439/72 |

FOREIGN PATENT DOCUMENTS 463245 7/1975 U.S.S.R. .
2101819 1/1983 United Kingdom .

OTHER PUBLICATIONS

Welcon Burn In/Test Contactors, Wells Electronics Inc. catalog, pp. 24 & 25.
"Soft-Touch" Flat-Pack Sockets, Textool Products Dept. of 3M, Brochure TD2606, 3-81.
Yamaichi, drawing KL-8131.
Yamaichi, catalog dated 7-'84.

Primary Examiner—Neil Abrams
Attorney, Agent, or Firm—Eric J. Groen

[57] ABSTRACT

A socket for a flatpack semiconductor package includes an insulative housing with a plurality of terminal receiving channels which open onto an upper package receiving surface. The channels are in lateral communication with apertures which are profiled for receiving tail portions of the terminals therethrough for interconnection of the tail portions to a printed circuit board. The electrical terminals are disposed within the channels with a contact portion situated above the package receiving face for contact with the flatpack semiconductor package leads. The terminals are designed with a lengthened beam section which forms the contact portion which defines the force deflection characteristics of the terminals to be somewhat insensitive to the insertion depth of the carrier. The housing includes latches on the ends of the housing which are rotatable to accept the carrier and which latch the carrier and package within the housing with the leads of the package loaded against the contact portions of the terminals with predetermined contact force. The latches are also rotatable about axes inward of their latching surfaces so that contact portions are wiped and backwiped against package leads. The contact leads are formed such that the barbs are formed from the area which is used as the carrier strip. The contacts also include widened bending portions which allow for stress relief through the bending radii.

12 Claims, 11 Drawing Sheets

Fig. 1 fig. 10

BURN IN SOCKET FOR FLAT PACK SEMICONDUCTOR PACKAGE

BACKGROUND OF THE INVENTION

1. Field of the Invention

The subject invention relates to a burn-in socket for a flatpack semiconductor package.

2. Description of the Prior Art

Semiconductor packages are arranged with several lead configurations denoting their use. One semiconductor package is known as the flatpack package and includes a plurality of leads extending from the package body with all leads arranged in a common flat plane. Typically all packages are tested in some manner to ensure their proper functioning, including burn-in testing where the devices are inserted into sockets and installed within large convection ovens and the packages are operated at elevated temperatures.

The package known as the flatpack semiconductor is a very fragile component, and as such, the package is typically installed within a carrier which includes an insulative housing to surround the package body, and a plurality of channels in which the leads reside. The carrier is placed within the socket during the burn-in testing and, when completed, the carrier and package are removed and the semiconductor package is shipped within the carrier for protection of the package leads. When the packages arrive at the manufacturer of the computer, or other user, the leads are partially cut off and the leads are prepared for surface mounting onto printed circuit boards.

The size and configuration of the burn-in sockets are dictated partially by the package geometry and partially by the burn-in facility, as sockets have to be compatible with the preexisting footprint of the burn-in printed circuit boards. The burn-in boards are printed circuit boards which are densely filled with sockets to receive the packages and carriers. The burn-in boards have traces to the sockets which power up the packages during their burn-in testing.

As it is a requirement in burn-in applications to maintain power to the package leads throughout the burn-in testing, it is a requirement specified by most package manufactures to maintain a constant contact force on the package leads in the range of 80-100 grams when the package is inserted within the sockets. Any contact force lower than 80 grams can result in discontinuity between the socket contacts and the package leads resulting in a loss of power to the package leads. A loss of power to the package, for any time frame during the burn-in cycle, would result in a scrapped package, as the packages are rarely tested twice as the heat effect alone on the package could be detrimental to its life. Thus if a package is not properly connected during the burn-in test, the package is discarded rather than retested.

One difficulty which has been experienced with present burn-in sockets in that the socket contacts are characterized by a steep force deflection curve, that is, a small change in deflection of the socket contacts results in a large increase in the contact force on the package leads. This is a disadvantage in the burn-in application as the conventional carriers are supplied by a variety of manufacturing sources, and the carriers can vary in thickness by 0.006 inches from each other. This differential in thickness directly results in an equal insertion depth differential, that is, the differential thickness is directly additive to the overall insertion depth. Given the step force deflection curve of up to 10 grams/0.001 inch, the contact force on several of the available sockets can vary drastically, as low as 40 grams on the lower end of the deflection while yielding the socket contact at the upper end of the deflection. The yielding of the contacts is due to the large concentration of bending stress located at the bending radius.

Another difficulty which has been experienced with present burn-in sockets relates to the fragility of the package leads. Several package manufacturers have leads which are made of KOVAR (KOVAR is the trademark of Carpenter Technology Corporation for an iron-nickel-cobalt alloy) overplated with gold. The difficulty relates to the configuration of the socket contacts themselves, the contacts having a tuning fork shape with one of the forks lying in the horizontal plane adjacent to the housing floor, while the other end of the fork includes an upwardly extending projection which forms the contact point which has a very small radius. If the contact force on the contact is high, the small radiused contact can mark or dimple the package lead which results in a defective package, causing the manufacturer to discard the package.

Another difficulty which has arisen with the burning in of semiconductor components relates to the buildup of oxides on the contact lead which results in a lack of contact between the socket contact and the package lead. As several of the available socket contacts are configured as the tuning fork arrangement described above, the contact's movement during the insertion of the package is only vertical, which provides no wiping action between the socket contact and the package lead. Wiping action typically clears the oxides from the package leads and provides a clean surface area for the contact to mate with resulting in a good electrical connection between the socket contacts and leads.

Other difficulties which have arisen relate to the fact that the packages are presently hand installed and removed from the sockets. Most sockets include an opening beneath the package body which allows heat dissipation from the package body during the test. When the packages are finished with the burn-in cycle, a bladed tool is inserted underneath the package and pulled upwardly to remove the package and carrier. It is common for the person removing the package to snag the end of the contacts with the end of the bladed tool which breaks or damages the socket contacts. As numerous sockets are installed on the burn-in boards, the damaging of the sockets results in a loss in burn-in production; either time is wasted by replacing the damaged socket, or if the socket is not replaced, the damaged socket is incapable for use thereby wasting valuable real estate on the burn-in board.

It is another disadvantage of the present burn-in sockets that the latching arrangements are such that they rotate about one end only, covering the top of the socket and carrier and latching to the housing at the end opposite its rotation point. This makes it difficult for assembly equipment to install and remove the carriers as the latch must be held and moved in simultaneous vertical and translational motion. Although it is possible to load and unload these sockets with an assembly machine having a multi-directional hand, such as a three directional robotic assembly machine, it would be virtually impossible for use with assembly equipment having only vertical, or one directional movement. It can be appreciated that it is highly desirable to have the ability of loading and unloading the carriers and packages with assembly equipment having a single direction of travel, as the cost of such is comparably low as compared to sophisticated robotics having multi-directional movement capabilities.

SUMMARY OF THE INVENTION

It is an object of the instant invention to provide a flatpack connector having a shallow force deflection curve such that the thickness of the carrier can vary, resulting in a varied deflection of the socket contacts while maintaining the contact force between the contacts and the package leads within acceptable limits.

It is an object of the instant invention to distribute the concentrated bending stresses which are present at the bending radius of the terminal throughout a large portion of the terminals thereby lowering the bending stresses at any single position of the terminal.

It is an object of the instant invention to provide a semiconductor socket which can be loaded and unloaded by the use of automatic assembly equipment having only vertical movement.

It is an object of the instant invention to provide a semiconductor socket which provides a wiping action on the package leads during insertion of the carrier and package, and also provides backwiping such that the socket contact resides in a position of the package lead which was previously wiped clean, The first objective was met by designing a flatpack burn-in socket having an insulative housing means having a plurality of terminal receiving channels therein in communication with a plurality of apertures which extend below a mounting surface of the housing means. The force deflection curve of the terminals is characterized by a shallow curve due to maximizing the length of the beam which forms the contact portion.

The second objective was met by designing the terminals with a tapered section at least through the radius about which the terminal rotates thereby distributing the force through a larger area, thereby lowering the ending stress.

The third objective was met by including on the housing two latches which are rotatable with respect to the housing. The latches can be opened by the insertion of the carrier upon installation of the carrier, and can be opened by the assembly equipment which removes the carrier.

The fourth objective was met by designing the terminals such that vertical deflection of the carrier causes inward lateral wipe of the contact on the package leads, and by designing the latches such that the carrier has to be inserted beyond its latched position for the carrier to clear the latches, the carrier then springing upwardly against the latches. Thus the package leads are wiped during the installation of the carrier, and when the carrier springs back to its latched position against the latches, the contacts backwipe the leads and reside in a clean and wiped area of the lead.

Other objectives and accomplishments will be observed from a reading of the detailed description of the preferred embodiment which follows.

BRIEF DESCRIPTION OF THE DRAWINGS

FIG. 3 is a cross-sectional view through lines 3—3 of FIG. 1 showing one of the latch assemblies exploded from the connector housing.

FIG. 5E is a side plan view of an alternate embodiment terminal which is edge stamped within the original plane of the metal.

DETAILED DESCRIPTION OF THE PREFERRED EMBODIMENT

Figure 1:
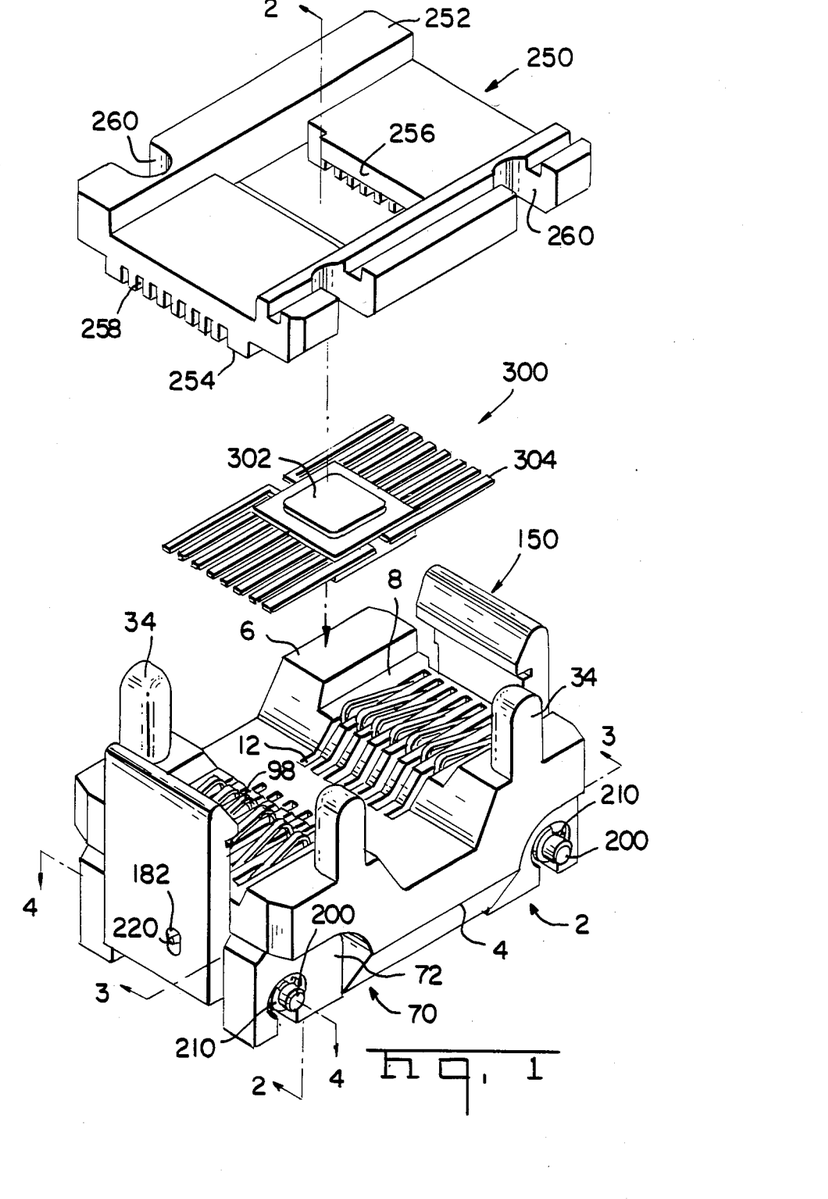
FIG. 1 is an isometric view of the assembled connector with the flat pack package and the carrier exploded from the connector.

Referring first to FIG. 1, a flat pack semiconductor package 300 is shown poised for receipt in a burn-in socket, the socket generally comprising a carrier member 250 and a connector member 2. The connector member 2 generally includes an insulative housing 4 with a plurality of electrical terminals 98 installed therein, and a latch assembly generally shown as 150. The semiconductor package generally includes a package body 302 having a plurality of package leads 304 extending outwardly from the body 302 and residing in a common flat plane.

The insulative housing 4 generally includes an upper surface 6, a lower package receiving surface 8 and a recessed surface 10. The insulative housing 4 also includes three guide posts 34 upstanding from the upper surface 6 to guide the carrier 250 during the installation of the semiconductor package 300. The insulative housing 4 further includes a plurality of channels 12 for receiving a plurality of electrical terminals 98, the channels 12 longitudinally extending between the surface 8 and the recessed surface 10.

The carrier member 250 generally includes an upper surface 252 and a lower surface 254. The central portion of the carrier includes an opening 256 which is profiled for receiving the body portion 302 of the flat semiconductor package 300. The carrier further includes a plurality of channels 258 extending along the lower surface 254 of the carrier, for receiving the leads 304 of the semiconductor package 300 and orienting them in a proper position with the socket contacts 98. The openings 260 of the carrier 250 are profiled for receipt over the posts 34 on the housing 4 which aligns the carrier and package with the socket 2.

Figure 2:
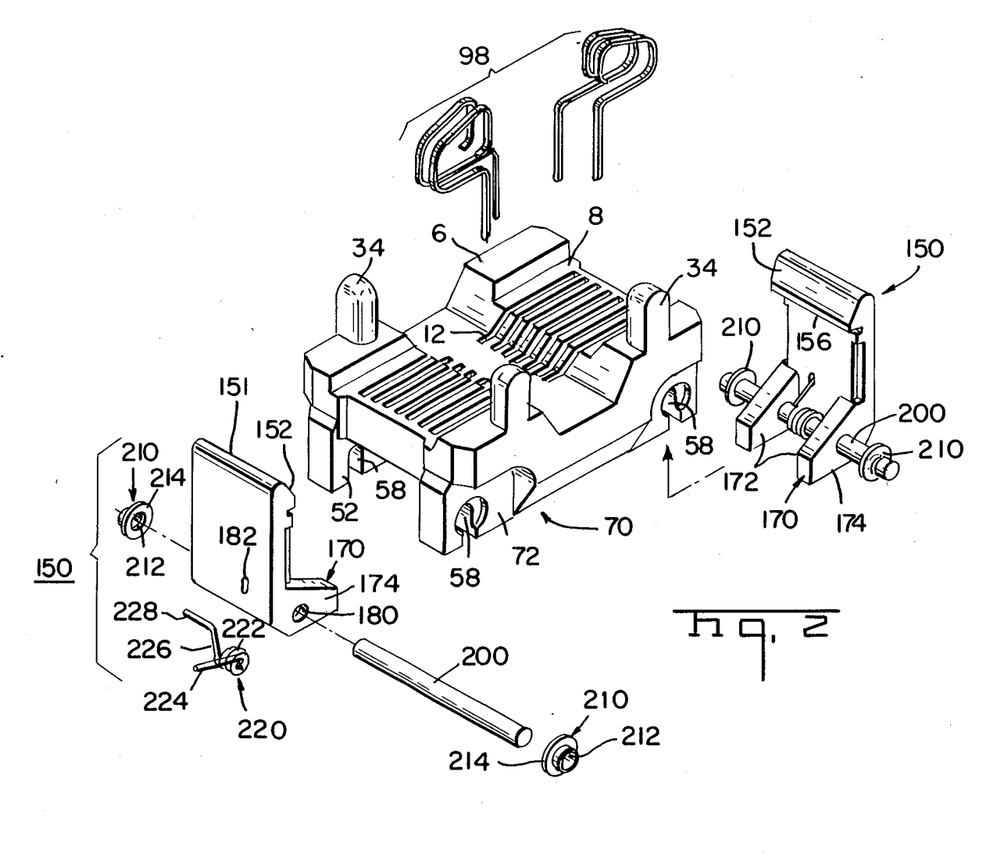
FIG. 2 is an isometric view of the connector showing the connector components exploded away from the connector housing.

With reference now to FIG. 2, the latch assembly is shown as including a latch member 151, a torsion spring 220, a pin 200, and two fasteners 210. The torsion spring includes a coil portion 222, a first leg 224, a second leg 226 and a portion 228 which extends laterally of the second leg 226. The fastener 210 includes an inner diameter 212 and an outer diameter 214, and is of the type which is compression fit over the pin 200.

With reference now to FIG. 3, the insulative housing 4 will be described in greater detail. FIG. 3 is a cross-sectional view through the insulative housing at a position where two opposed apertures 12 are located. A centrally molded rib 22 extends across the insulative housing 4 and separates the parallel and opposed sets of apertures 12. Each aperture 12 includes an inner surface 14 continuous with an inner surface 32, each of which is on the central web 22. An outer surface 30 is included which is rearward of the inner surface 32, the surfaces 30 and 32 defining apertures 20 and 18, respectively, for tail portions of the terminals. The aperture 12 also includes a rear surface 28 which is on the inside of the rear wall 40, surface 28 being continuous with inclined surface 26 and horizontal surface 24. As FIG. 3 is a cross-sectional view through a central portion of the insulative housing 4, a latch receiving area is shown as being defined by a rear surface 38, an inclined surface 42 and a generally vertical surface 44, each of the surfaces being on the exterior of the insulative housing. FIG. 3 also shows the latch supports shown generally as 50 including an inner surface 52, an outside surface 72 (FIGS. 1 or 2), a rear surface 54, a lower surface 56, and a U-shaped pin receiving slot 58.

FIG. 3 also shows a latch member which generally includes a wall portion 158 and a foot portion 170. The wall portion 158 includes an inclined surface 152 and a latching surface 156, a corner 154 being intermediate the surfaces 152 and 156. The wall portion 158 further includes an inner surface 160, a recessed surface 164 for clearance of the coil portion 222 of the spring 220, an outer surface 162, and an inclined surface 166. The foot portion 170 includes an inclined surface 178, a forward surface 176, an inside surface 172, an outside surface 174 (FIG. 2), and a pin receiving aperture 180.

Figure 4A:
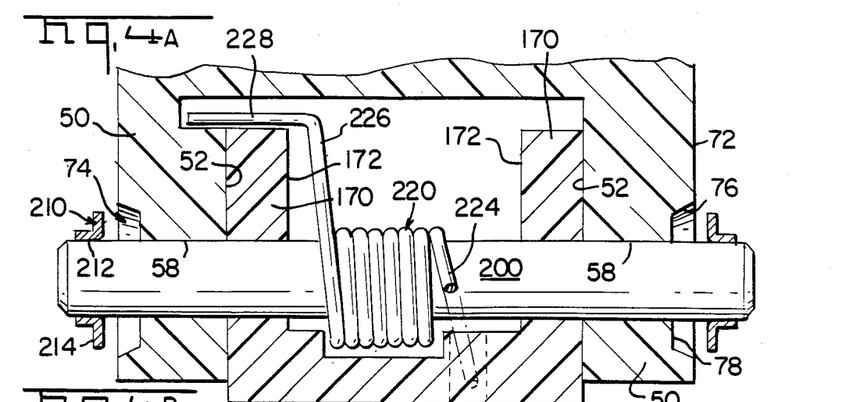
FIG. 4A is a cross-sectional view through lines 4—4 of FIG. 1 showing the preassembled latch assembly in position within the recess of the latch support post of the housing.

FIG. 4A is a cross-sectional view through lines 4—4 of FIG. 1 showing the U-shaped slot 58 in greater detail. Referring momentarily to FIG. 2, the U-shaped slot 58 is generally located within a well 70 which is recessed from the insulative housing side wall by means of the outer surface 72. FIG. 4A, then, shows the fastener seat generally as 74 being recessed from the surface 72 and including a frustoconical surface 76 extending inwardly to a back surface 78.

Figures 5A, 5C, 5D:
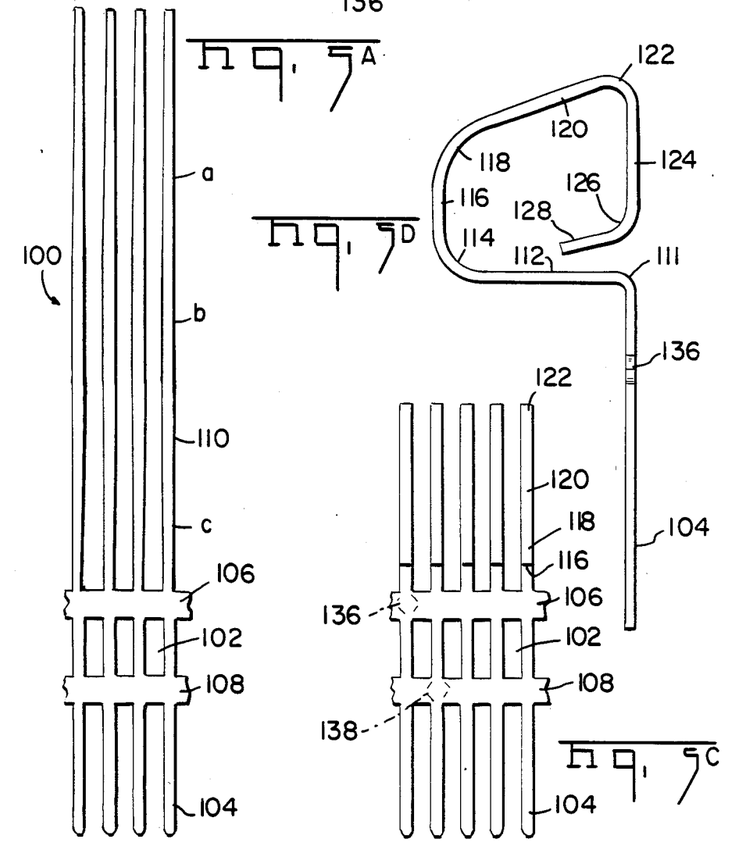
FIG. 5A is a top plan view of the terminals in the flat blank stage.
FIG. 5C is a top plan view showing the carrier strip with the formed contacts.
FIG. 5D is a side plan view showing the contact in the fully formed condition.

FIG. 5D shows the terminal 98 as generally including a tail portion 104 which is generally at a right angle with and continuous with a first leg portion 122 through a first radius 111. The first leg portion 112 is then continuous with a second radius 114 which defines a generally vertical section 116. The section 116 is continuous through a third radius portion 118 which defines a leg portion 120 which is inclined relative to the horizontal. A fourth radius portion 122 defines a downwardly extending portion 124 while a fifth radius portion 126 defines an end portion 128 extending into the loop.

Figure 5B:
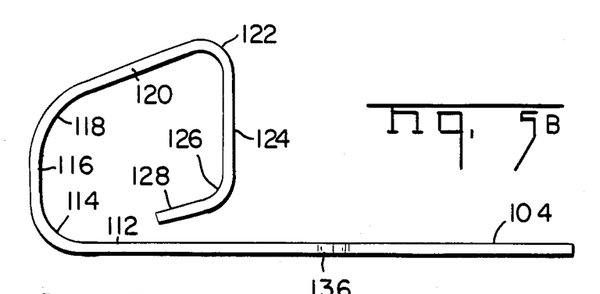
FIG. 5B is a side view showing the formed contacts while still connected to the carrier strip but prior to the formation of the tail portion.

The terminals 98 are stamped into a flat metal blank shown generally as 100 in FIG. 5A with the carrier strip formed internally of the contacts. The flat blank 100 includes a first band portion 106 and a second band portion 108 which defines an elongate carrier strip hole 102. With the individual terminals still retained to the carrier strip portions 106 and 108, the terminals are formed into the configuration as shown in FIG. 5B.

Figure 6:
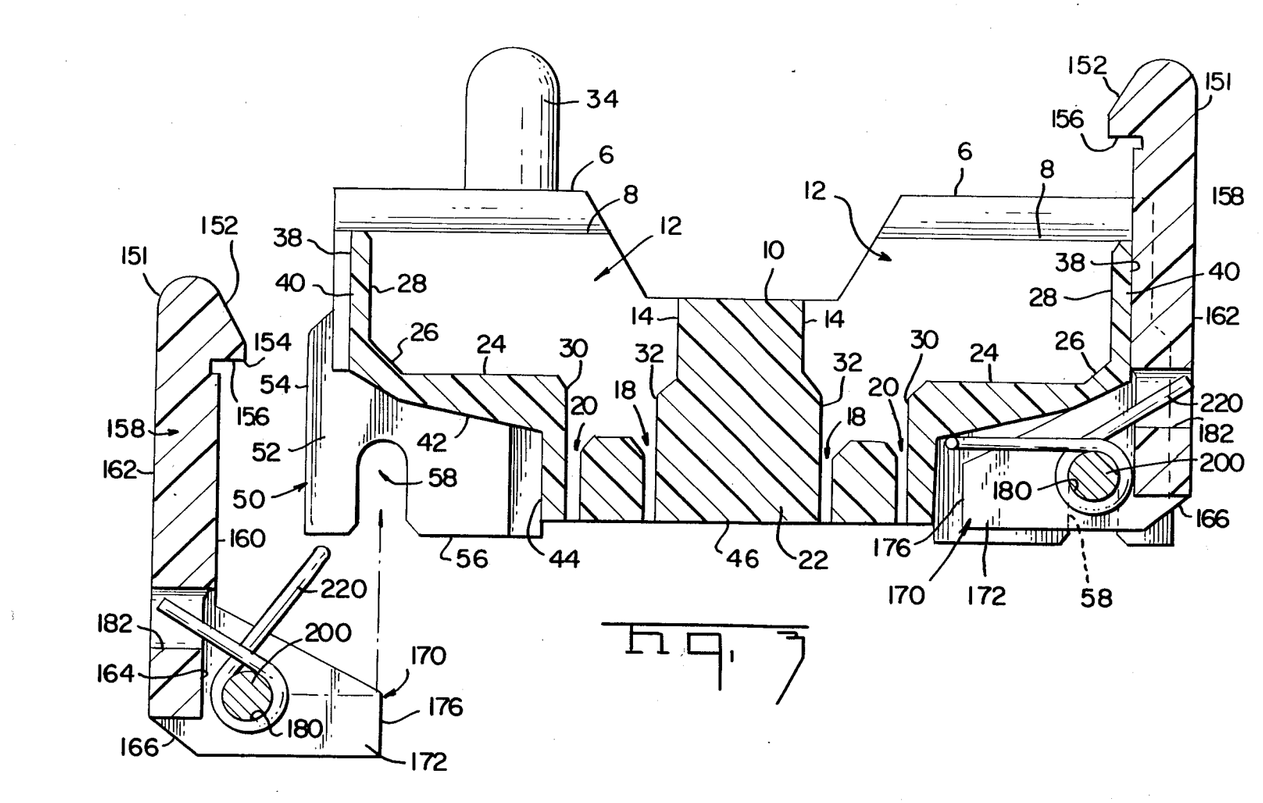
FIG. 6 is a cross-sectional view similar to that of FIG. 3 showing the flat pack semiconductor package and carrier poised for insertion into the connector housing.

FIG. 6 shows the terminals 98 in an undeflected condition within the apertures 12. The terminal 98 includes the sections 112, 116, 120 and 124 interconnected by radii 114, 118, 122 and 126, respectively. In order to have a contact with a shallow force deflection curve, the terminal was specifically designed so as to have a lengthened beam section which forms the contact portion. It should be noticed that the portion 116 is adjacent to the housing back wall 28, and the terminal then includes a portion 120 which is inclined relative to the section 116. Thus by lengthening the beam which forms the contact portion, the force deflection curve is defined as a shallow curve, that is, large deflection of the contact results in a small increase in contact force.

Remembering that the contact force between the socket contacts and the package leads must be maintained at a force of approximately 100 grams, the material which forms the contacts must be relatively stiff. In the preferred embodiment of the invention, the contacts are formed by Beryllium Nickel, although other materials such as Beryllium Copper, stainless steel, and the like, are meant to be within the scope of the invention. Sine the material is less ductile, the contact is modified somewhat to prevent fracturing the contact at the radii 114 or 118.

Referring now to FIG. 5A, the blank of stamped terminals 98 is shown. The beam section 110 is tapered between the sections marked a and c, such that a wide section b exists therebetween. In the preferred embodiment of the invention, each section above a and below c, is approximately 0.0185 inches whereas the section denoted as b is approximately 0.0225 inches in width. As shown in FIG. 6, the radius 114 typically sees the highest stress within the contact during deflection, and is within the tapered section b. In fact, the tapered section is long enough to also include the radius 118, as shown in FIG. 6. Since the radiused sections 114 and 118 are tapered to be wider than the remainder of the contact, the stress which results from the contact between the package lead and the contact 98, is distributed through the tapered section b such that no stress concentration results at 114.

The tapered section also increases the moment of inertia thereby strengthening the beam at radius 114, such that downward deflection of the terminal caused by a contact force at 122 results in rotation about radius 111, 114 and 118. The rotation of the terminal about radius 111 causes the contact points at the radii 122 to each move closer to the center of the housing, which causes a wiping action between the terminal and the package lead; the nature of which will be described in greater detail subsequently.

At this point, attention is drawn to FIG. 6 where it is shown that the terminals 98 comprise offset contact legs 104 to correspond to staggered through holes in the printed circuit board. As shown in FIG. 5C, barbs 136 and 138, shown in phanton, may be removed from the carrier strip portions 106 and 108, respectively, which will place the barbs 136 and 138 within the apertures 20 and 18, respectively (FIG. 3), as shown in FIG. 6. Stated differently, carrier strip portions 106 and 108 are spaced apart a distance, and spaced up from the ends of the tail portions 104 such that a barb struck from the carrier strip portions 106 and 108 will be placed within the apertures 20 and 18.

It has been found that to get a smooth edge to the tapered section, the entire tapered section must be stamped simultaneously. Thus a long die is required to stamp the tapered beam section of the terminal. When considering stamping operations, consideration must be given to the repairability of the stamping dies. As the die which forms the taper will have to sharpened, the barb should not be placed within the confines of the taper, as this would place the barb stamping section of the die integral with the die which stamps the taper. This would mean that the die could not be sharpened as this would remove the profile of the barb from the die. This is also true of the tail portion since the length of the tail portion is also significant with respect to the length of the die. If the barbs were stamped directly from the tail portion, the die would also be long and would not have the ability to be sharpened. However, by integrating the barb within the carrier strip, the die which stamps out the barbs 136, 138 can be very small reducing the overall tooling requirements and repairs. Furthermore, this reduces the overall tooling requirements as a die is not required to remove a carrier strip. Since the carrier strip is formed within the envelope of the terminals, less metal is wasted in the processing of the terminals, that is, if the carrier strip was formed outside of the envelope of the terminals, the carrier strip is simply stamped off and is scrap metal.

With the carrier strip portions 106 and 108 removed, the terminals may be formed to the configuration shown in FIG. 5D and the terminals inserted within the housing apertures 12. It should be understood that all terminals have a portion 116 which is adjacent to the rear wall 28, and it is the length of the terminal tail portion 104 which varies in length, that is, tail portions 104 shown in FIG. 6 are of varying lengths.

With the terminals 98 inserted within the apertures 12 of the insulative housing 4, the latch members can be inserted into the insulative housing 4. As shown in FIG. 2, a latch assembly 150 can be preassembled, that is, the pin 200 can be inserted through the hole 180 of the latch and the spring coil portion 222 inserted over the end of the pin and the end of the pin inserted through the other hole 180 in the other leg 170 of the latch member 150. The two fasteners 210 can be partially inserted over the ends of the pin holding the spring 220 onto the pin 200. In the preassembled stage, the distance between the two fasteners 210 is greater than the distance between the two outer surfaces 72 in which the fasteners 210 will reside. The spring is installed over the pin such that the first leg 224 extends through the aperture 182 in the rear wall 158 of the latch member 150. It should be noted that other alternatives besides two fastener members 210 will be suitable, such as using a pinned or cold headed end with a fastener member at the opposite end only.

Figure 4B:
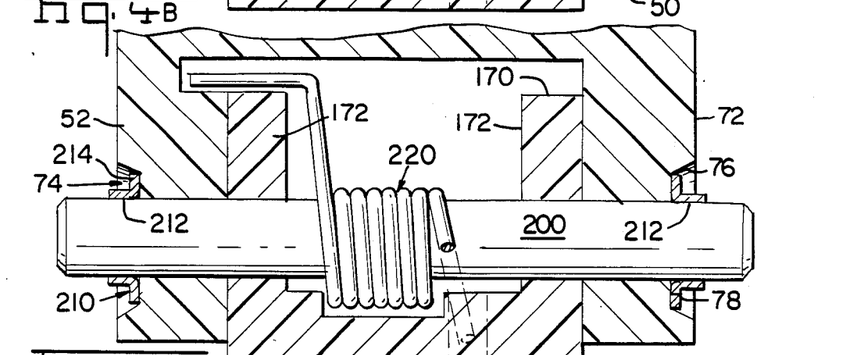
FIG. 4B is a view similar to that of FIG. 4A showing the position which a small radius fastener resides within the recess.
Figure 4C:
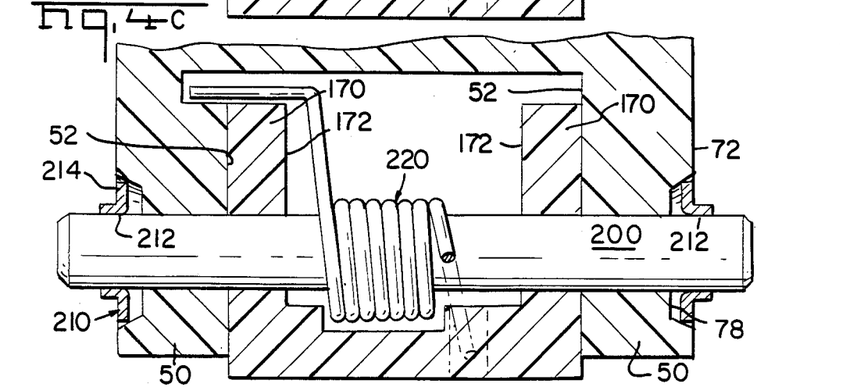
FIG. 4C is a view similar to that of FIG. 4A showing the position which a large radius fastener resides within the recess.

With the latch member 150 so preassembled, the latch member may be inserted over the latch supports 50 with the pin 200 extending through the open ended U-shaped slot 58, as shown in FIG. 3. FIG. 3 also shows that spring 220 is preloaded by its insertion into the housing be the deflection of the torsion spring 220. FIG. 4A shows a detail of the recess 74 which includes a frustoconical surface 76. With the latch assembly aligned such that each of the fasteners 210 is aligned with the recess 74, the fasteners 120 can be subjected to a press forcing the fasteners inwardly until they are seated upon the frustoconical surface 76. It has been found advantageous to define the recess 74 having a frustoconical surface 76 as the geometry of the fasteners tend to vary. It is typical with fasteners in this size range, approximately 0.150 inches in diameter, that the pin hole diameter 212 is concentric with the outer diameter 214, however, the outer diameters 214 tend to vary somewhat. Rather than trying to hold the dimension of the outer diameter 214 of the fastener 210 to an inner diameter of a retainer recess, the retainer ring seat 74 is designed with a frustoconical surface 76 which accepts a range of diameters of fasteners 210. For example, if a fastener is used which has a small diameter, as shown in FIG. 4B, the fastener will simply be inserted deeper into the seat 74, whereas if a large diameter fastener is used, the fastener will reside closer to the outer surface 72.

As shown in FIG. 6, when a flat pack semiconductor package 300 is to be placed within the connector 2, the package 300 is placed within the carrier 250 such that the package body 302 resides within the opening 256 of the carrier 250 and the leads 304 reside within the lead receiving channels 258. When the carrier is brought downwardly, the alignment slots 260 within the carrier mate with the alignment posts 34 of the insulative housing 4 to orient the semiconductor package leads with respective terminal contact portions.

Figure 7E:
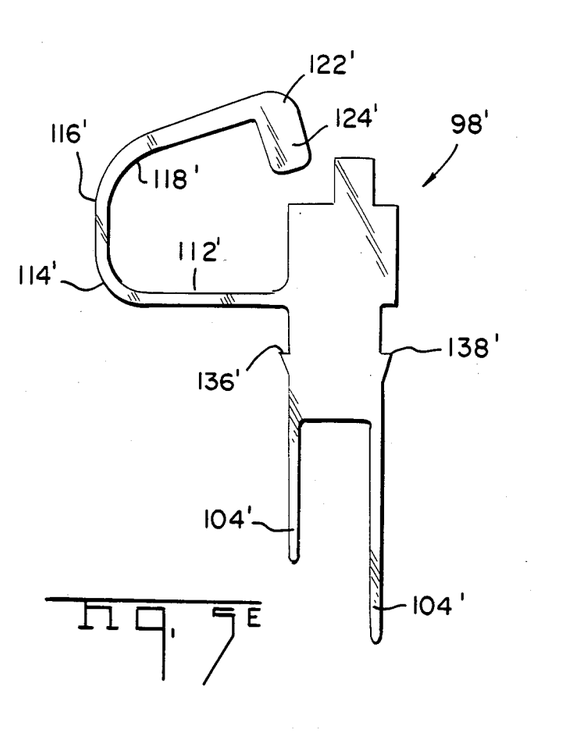
FIG. 7 is a view similar to that of FIG. 6 showing the carrier and the flat pack semiconductor package partially inserted into the connector showing the carrier forcing the latches outwardly.
Figure 8:
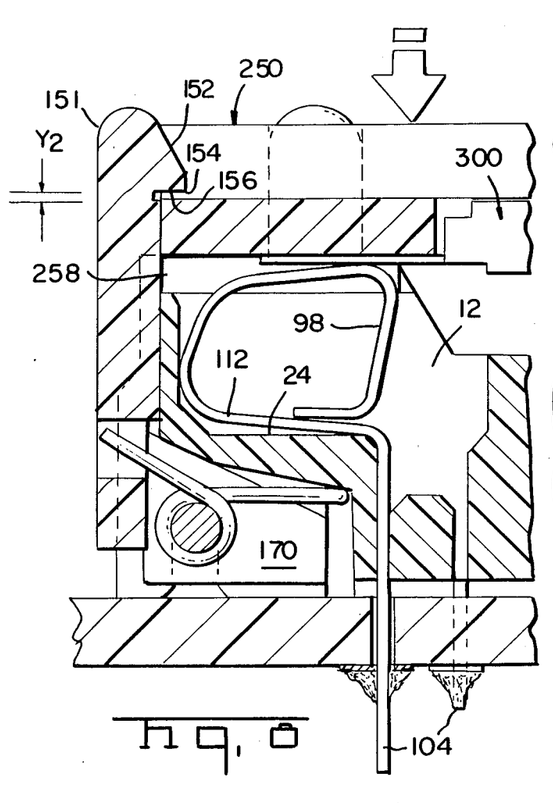
FIG. 8 is a view similar to that of FIG. 9 showing the carrier at a position where the latch has just cleared the carrier, but the carrier has not sprung back against the latch.

It should be appreciated that the latches 150 include inclined surfaces 152, such that as the carrier 250 is brought downwardly, as shown in FIG. 7, the carrier 250 begins to move the latches outwardly to accept the semiconductor package and the carrier 250. FIG. 8 represents the position in which the carrier must be pushed downwardly such that the corner 154 of the latch 150 clears the corner of the carrier, allowing the carrier to latch therein. If the carrier is manually removed, the latches are forced apart allowing the retraction of the carrier 250 and package 300.

Figure 11A:
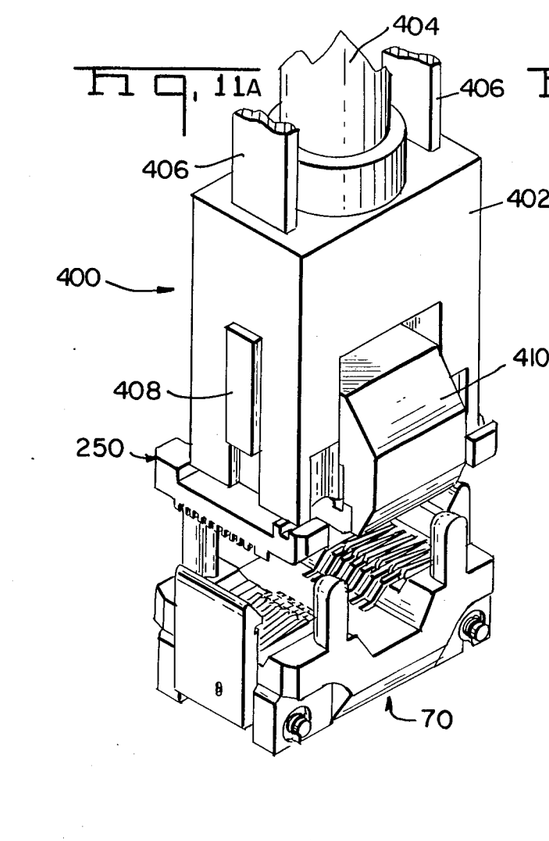
FIG. 11A is an isometric view of an automatic tooling hand inserting the carrier and package within the socket.
Figure 11B:
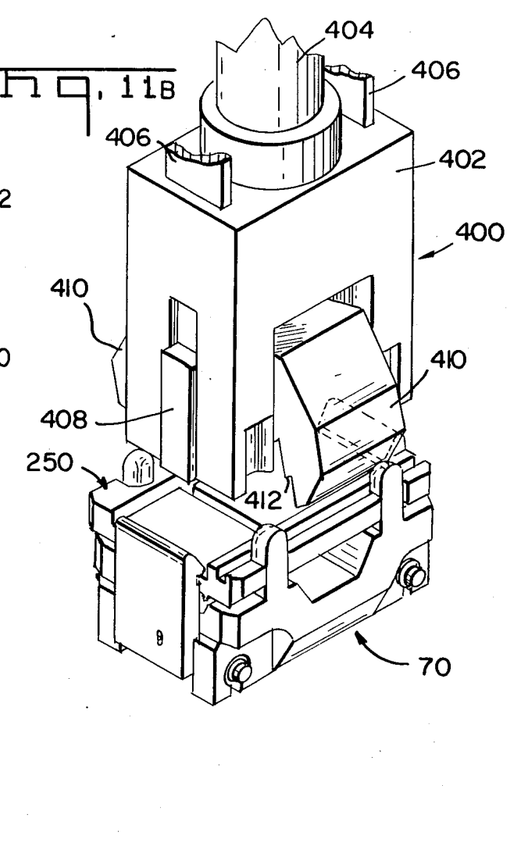
FIG. 11B is similar to that of FIG. 11A showing the hand removing the socket.

As designed, the socket is also suitable for use with either a robotic assembly machine or simply an assembly machine having a single axis of movement, that being vertical. As shown in FIGS. 11A and 11B, the hand 400 of the assembly machine would include a body portion 402 which is vertically moveable by means of a piston 404. The hand 400 would further include a retractable cam member 406 which has a cam surface 408 at its lower end. Rotatable jaws 412 are included which pick up the carrier, the jaws having shoulders 412 on the interior surface of the jaw for exerting downward force on the carrier. As shown in FIG. 11A, the jaw can hold the carrier and exert a downward force on the socket. Such that the carrier forces the latches open to allow entry of the carrier as shown best in FIG. 7. When the hand 400 is in the insert position it should be noted that the cams are fully retracted such that they do not contact the latches and keep them open. When it is desirable to remove the carriers and packages, the cams 408 are moved to their lowermost position and the jaws 408 opened to allow the jaw to surround the carrier. As shown in FIG. 11B when the hand is lowered, the cams 408 contact the inclined surfaces 152 which opens the latches, the carrier is then picked up by the jaws 410 and removed.

It should be noted from FIGS. 6 and 7 that the corner 154 of the latch 150 is located outside the center of the pin 200, which is also the center of rotation of the latch 150. Thus, outward movement of the latch 150, as shown in FIG. 7, results in a downward movement of corner 154, as shown in FIG. 7. In order to latch the carrier and package in place, the carrier must be extended to a vertical downward position which is below the latched position of the carrier, as shown in FIG. 8. Once the latch corners 154 clear the carrier, the latches are sprung inwardly and over the carrier. The carriers and flat pack are then resiliently biased upwardly to the position shown in FIG. 9. It should be noted in FIG. 9 that each of the terminals 98 reversely rotate somewhat in their apertures 12 to accommodate a new position, although it should be noted that the terminal portions 112 are still lifted somewhat off of the floor 24 of the aperture 12. The reverse rotation of the terminals causes the contact portions to backwipe the package lead such that the contact will reside a section of the package lead which has been cleared.

Figure 9:
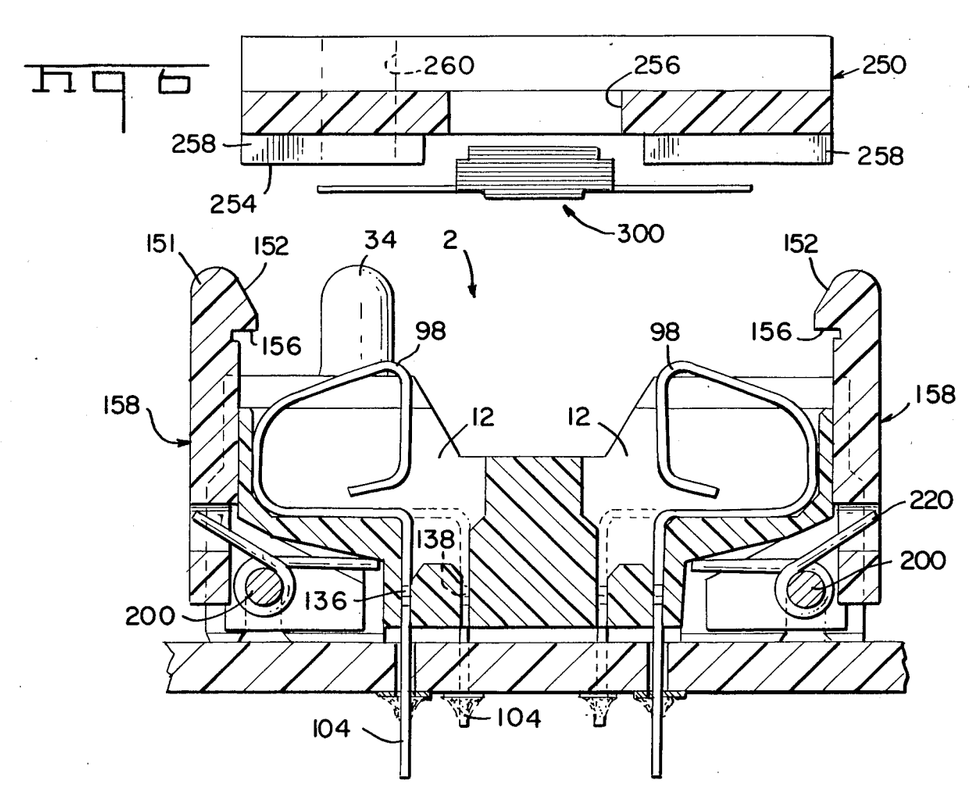
FIG. 9 is a cross-sectional view similar to that of FIG. 8 showing the latch in the fully latched position and the contacts returned to their connected position.
Figure 10:
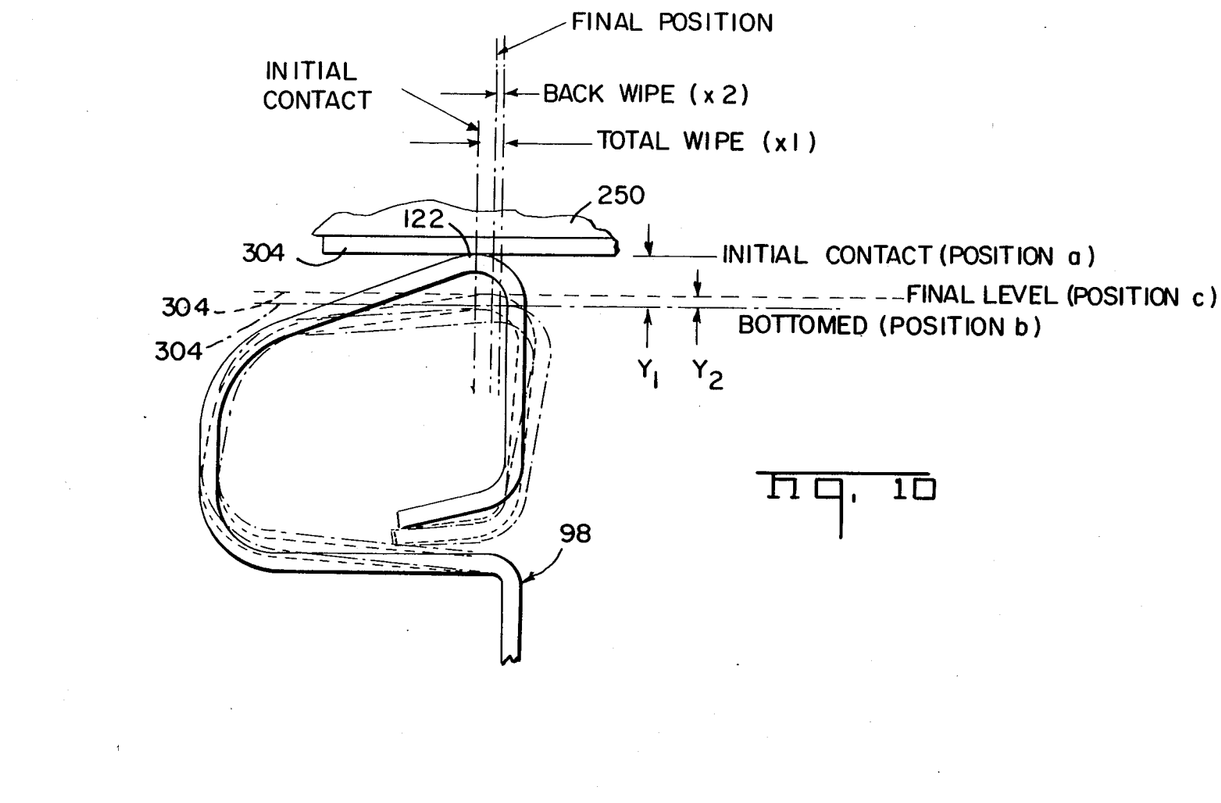
FIG. 10 is a diagrammatical view of the contact portion of the terminal against the package lead showing the lateral wipe and backwipe of the contact terminal during the insertion of the carrier.

As shown in FIG. 10, the lateral wiping and backwiping is shown more clearly in diagrammatical form. Position a is shown which represents the original position of the contact when the package lead 304 first contacts the radius portion 122 which forms the contact portion. As the carrier 250 is pushed downwardly to the position shown in FIG. 8 such that the latch corner 154 clears the top of the carrier 250, the downward deflection and rotation of the contact loop causes the radius portion 122 to vertically deflect a distance $y_1$, but also move laterally inward to the position shown as b in FIG. 10, wiping the package lead 304 a distance $x_1$ which clears the oxides off of the contact lead for that distance. When the carrier 250 returns to the latched position as shown in FIG. 9, the carrier moves upwardly a distance $y_2$ (FIG. 10) to now contact the latch shoulders 156. This causes the contact loop to reversely rotate within the aperture 12 which causes reverse lateral movement, backwipe, of the radius portion 122 against the package lead 304. The radius portion backwipes a distance $x_2$ to accommodate a new position c, as shown in FIG. 10. It should be appreciated that the original wiping of the contact a distance $x_1$, clears any oxides which would be present on the package lead 304. It should also be appreciated that when the radius portion 122 backwipes distance $x_2$ the radius portion 122 will now reside in a cleaned portion of package lead.

In the preferred embodiment, the terminals have exhibited very good electrical and mechanical qualities. The force deflection curve, due to the lengthening of the beam section, is very shallow, the contact force remaining between 100–116 grams during a change in deflection of 0.006 inches, and remaining in the range of 80–110 grams of contact force during a change in deflection of 0.015 inches. Furthermore, the horizontal movement of the terminal, the wiping action, nearly equals the vertical downward movement of the terminal, it has been found that 0.020 vertical deflection results in 0.017 inches in horizontal wipe.

It should be noted from FIG. 6 that the end of the contact is recessed below the surface 8 of the housing 4, thus if the packages are manually retracted using a bladed tool, the ends cannot be caught by the tool, thereby destroying the contacts.

Furthermore, the end 128 acts as an anti-overstress feature preventing overstressing the terminal at radius 114. As shown in FIG. 9, there is a downward vertical deflection which will cause the end 128 to contact the portion 112, which stiffens the spring constant of the contact and prevents the contact from over rotation about radius 114.

As shown in FIG. 5E, an alternate embodiment terminal is shown as 98', having sections which are analogous with the sections of the terminals of FIG. 5D and therefore are labeled with prime numbers. It should be noted that the terminal as shown in FIG. 5E is edge stamped which places all of the sections of the terminal in the original plane of the metal. Although the terminal 98' is equally compatible mechanically and electrically with the terminal 98, the terminal 98' is less efficient with respect to the usage of material and therefore is not the preferred embodiment.

The above mentioned invention was described by way of preferred embodiment only and should not be read so as to limit the claims which follow.

What is claimed is:

1. An electrical connector for interconnecting a flat-pack semiconductor package having a body portion with a plurality of leads extending outwardly therefrom in a common plane, the connector comprising:

an insulative housing member having a package receiving face and a mounting face, a plurality of channels disposed in a side-by-side relationship and opening onto the package receiving face, each channel being defined by a floor, sidewalls and a rear wall, the housing further comprising an aperture in communication with the channels and extending through the mounting face; and a plurality of terminals disposed within the channels with a tail portion extending through the aperture and beyond the mounting face, each terminal further including a first radius at a corner of the floor and aperture with a first portion of the terminal extending towards the rear wall and adjacent to the floor, the terminal including a second radiused portion adjacent to the rear wall defining a second section of terminal projecting upwardly, the second radiused portion having a cross sectional area greater than the remainder of the terminal causing the second radiused portion to have a greater moment of inertia about the second radiused portion, and a radiused contact portion extending from the second section of terminal and projecting above the package receiving face of the housing, the contact portion being vertically deflectable downwardly towards the floor, and the increased moment of inertia about the second radiused portion causing a rotation of the terminals within the channels and causing the first portions of the terminals to lift off of the floor, the rotation of the terminals causing the terminals to laterally displace inwardly causing a wiping action between the terminal contact portions and the package leads.

2. The connector of claim 1 wherein a third radiused portion is formed at an upper end of the second portion of terminal which projects a third terminal portion diagonally upward, the radiused contact portion being formed by a fourth radius which projects a fourth terminal portion downwardly towards the floor.

3. The connector of claim 1 wherein the terminal further comprises a third radius extending from the second portion of terminal which projects a third portion of terminal towards a center of the connector.

4. The connector of claim 3 wherein the terminal is tapered partially through the first portion of the terminal, through the second portion of the terminal and partially into the third portion of the terminal.

5. The connector of claim 4 wherein the terminals are stamped and formed from a flat metal blank.

6. The connector of claim 4 wherein the terminals are edge stamped from a flat metal blank.

7. An electrical connector for interconnecting flatpack semiconductor packages thereto, the package being receivable in a carrier having a plurality of channels therein for receiving the plurality of flatpack leads, the connector comprising:

an insulative housing means having an upper package receiving face and a lower mounting face, the housing means having a plurality of channels extending into the package receiving face in communication with apertures which extend to the lower mounting face;

a plurality of electrical terminals positioned within the channels, the terminals having looped portions which are disposed within the channels with portions extending above the package receiving surface to form radiused contact portions; and two latch members, one latch member disposed at each end of the housing means, each being rotatable on a horizontal axis about the ends thereof and outwardly of the housing means, the horizontal axes about which the latch members rotate are laterally inward of the latching surfaces, the outward rotation of the latch members thereby causing a downward motion of the latching surfaces, the latch members being biased inwardly in a normally closed position, the latch members having downwardly and inwardly facing cam surfaces on an inside surface thereof being profiled for mating interference with the carrier, where downward movement of the carrier rotates the latches open to receive the carrier, the latches springing shut to a position where the downwardly facing shoulders overlie the carrier, whereby when the carrier and package are inserted into the housing the latches open outwardly and the contact between the package leads and the terminal contact point causes a rotation of the looped portions, the contact points moving laterally inward against the package leads thereby wiping the package leads, and when the carrier reaches a vertical position within the housing where the latching surfaces clear the edges of the carrier, the latches bias closed, and the carrier moves vertically upward to a new position against the latching surfaces, the contact point backwiping the package leads to reside in a wiped area.

8. The connector of claim 7 wherein the cam surfaces and the latching surface of the latch form a corner which the carrier must clear during the insertion of the carrier and semiconductor package.

9. An electrical connector for interconnecting a semiconductor package and a carrier thereto, the connector comprising:

an insulative housing means having a plurality of channels located therein, the housing having latch supporting means located at each end thereof, the latch supporting means including a U-shaped slot opening downwardly, the housing further including an outer surface which is disposed above the U-shaped slot;

a plurality of terminals located within the housing;

a latch assembly including a latch member having an aperture extending therethrough, the assembly further including a torsion spring means, a pin and fastener means at the ends of the pin, whereby the latch assembly can be preassembled with the torsion spring means slidably placed over the pin and the fastener means preassembled to ends of the pin and the latch assembly can be slidably received into the housing with the pin residing in the U-shaped slot, with further inward movement of the fastener means securing the latch assembly to the housing.

10. The electrical connector of claim 9 wherein the housing means further comprises a recess means projecting inwardly from each sidewall profiled for receiving the fastener means.

11. The electrical connector of claim 10 wherein the fastener means comprises a circular fastener which press fits to the pin.

12. The electrical connector of claim 10 wherein the recess means is defined by a frustoconical inner diameter decreasing in diameter progressing inwardly.

* * * * *